US010580554B1

(12) United States Patent
Hansen

(10) Patent No.: US 10,580,554 B1
(45) Date of Patent: Mar. 3, 2020

(54) APPARATUS TO PROVIDE A SOFT-START FUNCTION TO A HIGH TORQUE ELECTRIC DEVICE

(71) Applicant: Raymond Innovations, LLC, Rapid City, SD (US)

(72) Inventor: Will Hansen, Rapid City, SD (US)

(73) Assignee: RAYMOND INNOVATIONS, LLC, Rapid City, SD (US)

( * ) Notice: Subject to any disclaimer, the term of this patent is extended or adjusted under 35 U.S.C. 154(b) by 38 days.

(21) Appl. No.: 16/017,574

(22) Filed: Jun. 25, 2018

(51) Int. Cl.
| *H01C 1/084* | (2006.01) |
| *H05K 7/20* | (2006.01) |
| *H01C 1/028* | (2006.01) |
| *H01C 7/00* | (2006.01) |

(52) U.S. Cl.
CPC ............. *H01C 1/084* (2013.01); *H01C 1/028* (2013.01); *H01C 7/008* (2013.01); *H05K 7/209* (2013.01); *H05K 7/20409* (2013.01); *H05K 7/20463* (2013.01)

(58) Field of Classification Search
CPC ........ H01C 1/084; H01C 7/008; H01C 1/028; H05K 7/2039–20518; H05K 7/2089–209
See application file for complete search history.

(56) References Cited

U.S. PATENT DOCUMENTS

| 3,670,811 | A | * | 6/1972 | Christensen | ............... | F28F 1/12 |
| | | | | | | 165/134.1 |
| 5,610,571 | A | * | 3/1997 | Kuzuoka | ............... | G01D 11/245 |
| | | | | | | 338/22 R |
| 6,161,389 | A | * | 12/2000 | Sekiya | .................... | F02G 1/043 |
| | | | | | | 62/6 |
| 6,948,909 | B2 | * | 9/2005 | Meshenky | .......... | F02B 29/0412 |
| | | | | | | 165/125 |
| 7,059,769 | B1 | * | 6/2006 | Potega | ................ | B60L 11/1861 |
| | | | | | | 374/185 |
| 9,383,093 | B2 | * | 7/2016 | Tilmont | .................. | E21B 36/02 |
| 10,383,253 | B1 | * | 8/2019 | Mujcinovic | .......... | H05K 5/0039 |
| 2007/0127310 | A1 | * | 6/2007 | Metcalfe, III | .......... | F28D 7/106 |
| | | | | | | 366/230 |
| 2010/0163213 | A1 | * | 7/2010 | Xu | ....................... | F28D 15/0208 |
| | | | | | | 165/104.26 |
| 2011/0095621 | A1 | * | 4/2011 | Petersen | ............. | H01H 37/002 |
| | | | | | | 307/117 |
| 2016/0302475 | A1 | * | 10/2016 | Penrose | ................... | A24D 3/04 |

* cited by examiner

*Primary Examiner* — Zachary Pape
(74) *Attorney, Agent, or Firm* — Goodhue, Coleman & Owens, P.C.

(57) ABSTRACT

Apparatus having means for cooling a current limiting thermistor which includes an elongated power cord first and second power conductors connected to respective male and female connectors at the axial extremities thereof and a thermistor disposed in series with at least one of the first and second power conductors, potting compound surrounding an axial part of said first and second power conductors as well as the thermistor. The apparatus further includes an elongated sleeve shaped heat exchanger dimensioned and configured with a central bore for thermal contact with the exterior of the potting compound. The heat exchanger has a plurality of fins disposed substantially in mutually parallel relationship as well as in substantially parallel relationship to an axial part of the first and second power conductors.

13 Claims, 3 Drawing Sheets

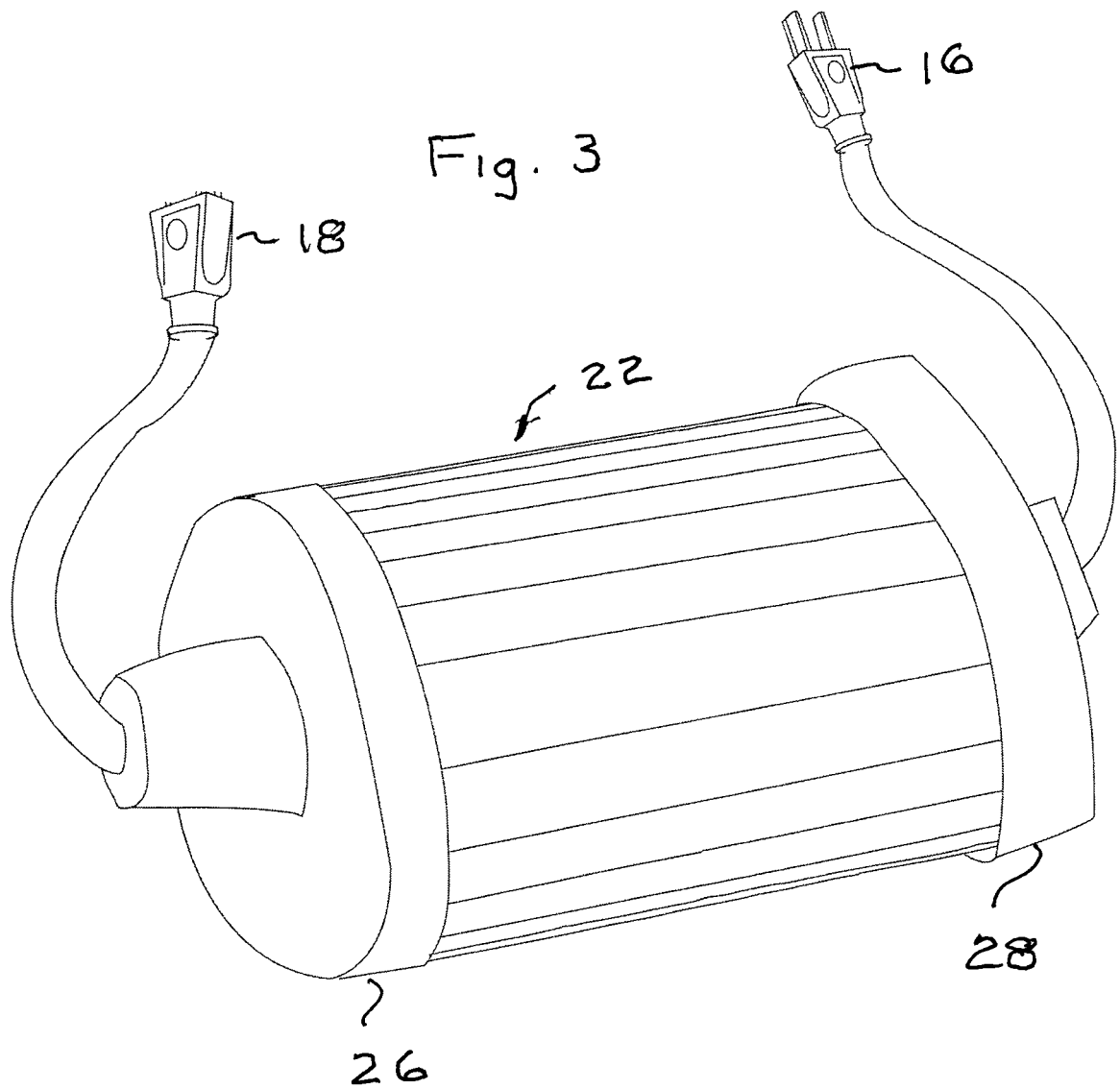

APPARATUS TO PROVIDE A SOFT-START FUNCTION TO A HIGH TORQUE ELECTRIC DEVICE

TECHNICAL FIELD

The present invention relates to the initial start-up of high-current electric devices such as saws or other power equipment and, more particularly, to the physical impact of the high torque jump or jolt upon start-up and provides a more gradual speed increase or soft-start.

BACKGROUND OF THE INVENTION

High inrush current produced when equipment is turned on may result in damage to electrical devices as well adjacent apparatus. In addition, for example, personal injury may even occur. For example, a large power drill can break the wrist of a user. A safe and cost effective way to reduce inrush current is to use an inrush current limiter (Surge Limiter), which is a special type of negative temperature coefficient (NTC) thermistor.

Typically, an NTC thermistor's resistance drops logarithmically as its body temperature increases. The function of a Surge Limiter is to first block the inrush current and then effectively remove itself from the circuit. The limiter blocks the incoming current spike by offering a relatively high resistance at turn on.

Typical resistance ranges are from 0.25 ohm to 220 ohm, depending on the amount of protection desired. As current flows through to the Surge Limiter, the resistance drops to as low as 0.01 ohm, which functionally removes it from the circuit.

Typically, a thermistor is connected in series with a load. It is operationally desirable to limit the time in which the resistance of the thermistor is high. Thus, it is highly desirable to quickly cooldown the thermistor after the load has reached steady-state conditions. One approach would be to use a fan or blower to quickly cooldown the thermistor. Such an approach is not particularly appealing because such an approach would add complexity to the apparatus as well as the need for a power source to drive the fan or blower.

The present apparatus relies on a heat exchange apparatus having characteristics to dissipate the heat.

From the above, it is therefore seen that there exists a need in the art to overcome the deficiencies and limitations described herein and above.

SUMMARY OF THE INVENTION

The shortcomings of the prior art are overcome and additional advantages are provided through apparatus having means for cooling a current limiting thermistor which includes an elongated power cord first and second power conductors connected to respective male and female connectors at the axial extremities thereof and a thermistor disposed in series with at least one of the first and second power conductors, potting compound surrounding an axial part of said first and second power conductors as well as the thermistor. The apparatus further includes an elongated sleeve shaped heat exchanger dimensioned and configured with a central bore for thermal contact with the exterior of the potting compound. The heat exchanger has a plurality of fins disposed substantially in mutually parallel relationship as well as in substantially parallel relationship to an axial part of the first and second power conductors.

In some embodiments the apparatus the elongated sleeve shaped heat exchanger conforms to a substantially cylindrical envelope.

The potting compound may conform to an outer envelope that is a parallelepiped.

The potting compound has a thermal conductivity of at least 4 W/m·K

Additional features and advantages are realized through the techniques of the present invention. Other embodiments and aspects of the invention are described in detail herein and are considered a part of the claimed invention.

The recitation herein of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 3 is a view of the final assembly in accordance with one form of the present invention illustrating the base install was in the heat exchanger pastor installation of respective first and second end caps for protecting the cable.

DETAILED DESCRIPTION

A typical "inrush current limiter," or ICL, limits inrush current by initially impeding it with 10 ohms of resistance while at room temperature. When a power tool starts up, this initial resistance/current creates a lot of heat which causes the resistance of the ICL to drop over a 1-2 second period due to its negative temperature coefficient.

Figure 1:
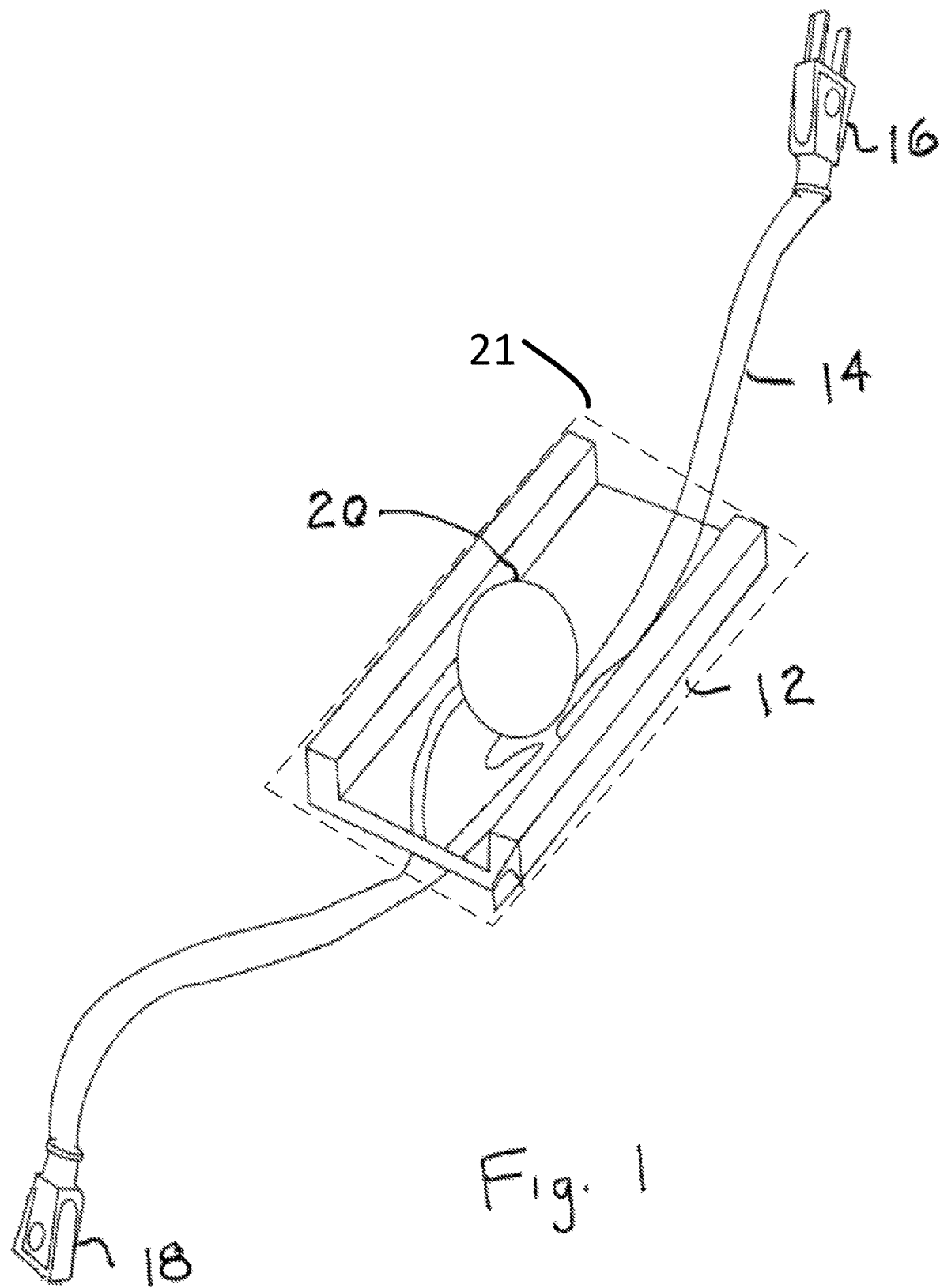
FIG. 1 is an isometric view of an assembly that is part of one embodiment of the present invention, the assembly includes a base, an elongated power cord having at least 2 conductors and having male and female connectors at the axial extremities thereof as well as a negative temperature coefficient thermistor disposed in series in the live conductor.

The "recovery time" for the ICL to cool back down to the original 10 ohms is typically between 60-240 seconds. This is way too long when being used with power tools. Accordingly, the present invention is intended to speed up the cool down process. The most cost-effective method of doing so was to incorporate a finned heat sink. To maximize heat transfer, the assembly illustrated in FIG. 1 is fully encapsulated in a highly thermally conductive potting compound 21 and disposed snugly engaging the interior for heat transfer the interior of a 360-degree heat sink enclosure. The "recovery time" with the apparatus in accordance with the present invention is 30-60 seconds because of this additional cooling.

Referring now to FIG. 1 there is shown an assembly comprising a base 12 and a power cord 14. The power cord 14 as at least two conductors extending between a male connector 16 and a female connector 18. Commonly, substantial power tools will utilize power cords 14 having three conductors. For the purposes of description of the invention it will be understood that there is forms of the invention have at least two conductors. Connected in series relationship with a conductor carrying power to apparatus connection to the connector 18 is a thermistor 20.

Figure 2:
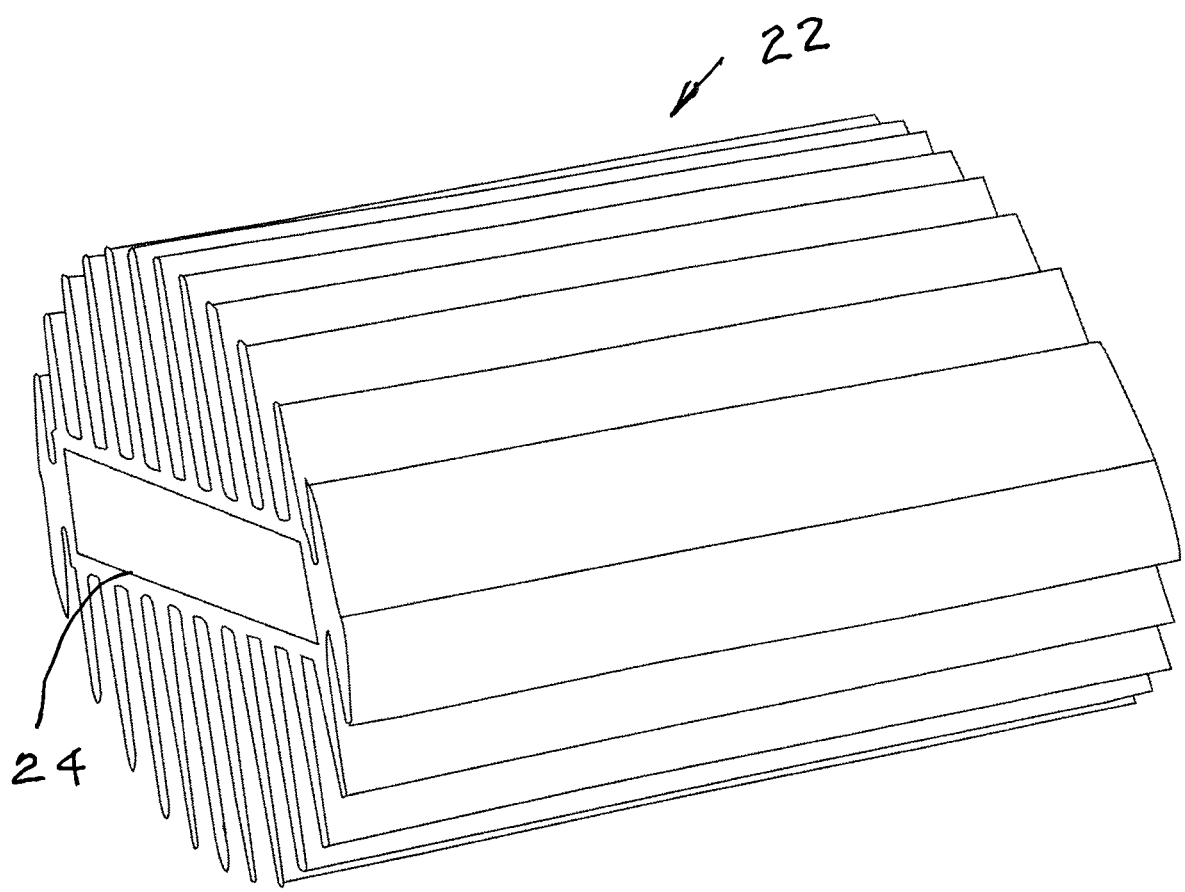
FIG. 2 is an isometric view of a heat exchanger in accordance with one form of the present invention that is dimensioned and configured for receiving the base illustrated in FIG. 1 in a central bore thereof.

Referring now to FIG. 2 there is shown one embodiment of a sleeve shaped heat exchanger 22 having a central bore 24 having a rectangular cross-section. In the illustrated embodiment central bore 24 extends throughout the entire actual extent of the heat exchanger 22. The central bore 24 is dimensioned and configured for close fitting thermal engagement with the exterior of the assembly shown in FIG. 1 after that assembly has been encased in potting compound 21. In the illustrated embodiment the outer envelope of the heat exchanger 22 conforms to a cylinder that is concentric with the central bore 24.

Referring now to FIG. 3 there is shown the final assembly of one embodiment of the present invention that includes the assembly shown in FIG. 1 and two together with end caps 26, 28 that engage the axial extremities of the heat exchanger 22 and provide support and protection for the power cord 14.

In a typical embodiment the heat exchanger is 6063 aluminum alloy with T5 temper and a black anodized, painted, or mill finish having a weight per foot of 0.619 lbs. The weight for one embodiment is approximately 0.362 lbs. having a length of 3.504 inches.

One embodiment of the present invention utilizes an Ametherm AS32 10015 thermistor (marketed by Ametherm of Carson City, Nev.), however, there are other products that will work with similar results. For example, products with higher current capacity. The potting compound 21 in a preferred embodiment is a 2 component, aluminum filled epoxy system with excellent thermal conductivity and superior adhesion identified by the part number 70-3812NC and marketed by Epoxies, Etc. of Cranston, R.I. It has a thermal conductivity of 4.5 W/m·K.

In a preferred embodiment the power cord 14 is a 14AWG, 3 conductors with NEMA 5-15 male and female plug ends. All connections to thermistor will be soldered and sealed connections.

The end caps 26, 28 are rubber and engage approximately 0.5 inch of the axial extremity of the heat exchanger 22 in some embodiments. The end caps 26, 28 each engage a 0.5 inch axial extremity of the heat exchanger 22 and provide a strain relief for the power cord.

The 8 mm thick, 30 mm diameter thermistor lies flat within the 9 mm×38 mm×3.5 inch long base 12 in one embodiment.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

Although the description above contains many specifics, these should not be construed as limiting the scope of the invention, but as merely providing illustrations of some of the presently preferred embodiments of this invention. Thus, the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. An apparatus having means for cooling a current limiting thermistor which comprises:
    an elongated power cord having a first and second power conductors connected to respective male and female connectors at the axial extremities thereof and a thermistor disposed in series with at least one of said first and second power conductors,
    a potting compound surrounding an axial part of said first and second power conductors as well as said thermistor,
    an elongated sleeve shaped heat exchanger dimensioned and configured with a central bore for thermal contact with the exterior of said potting compound, said heat exchanger having a plurality of fins disposed substantially in mutually parallel relationship.

2. The apparatus as described in claim 1 wherein said elongated sleeve shaped heat exchanger conforms to a substantially cylindrical envelope.

3. The apparatus as described in claim 1 wherein the central bore which is parallelepiped.

4. The apparatus as described in claim 3 wherein said potting compound conforms to the central bore which is parallelepiped.

5. The apparatus as described in claim 1 wherein said potting compound has a thermal conductivity of at least 4 W/m·K.

6. An apparatus for cooling a current limiting thermistor, comprising:
    a base having a top and bottom spaced between opposing ends and side edges;
    an elongated power cord having opposing ends terminating in a male power conductor and a female power conductor, the male power conductor extending from one of the opposing ends between the side edges of the base and the female power conductor extending from another one or the opposing ends between the side edges of the base;
    a thermistor operably connected in series with the male power conductor and the female power conductor, the thermistor disposed between the opposing ends and side edges of the base;
    a thermally conductive potting compound fully encapsulating the base, an axial portion of the male power conductor, an axial portion of the female power conductor, and the thermistor; and
    a cylindrical, elongated sleeve shaped heat exchanger dimensioned and configured with a central bore for thermal contact with an exterior of the potting compound, the heat exchanger having a plurality of fins disposed substantially in mutually parallel relationship.

7. The apparatus of claim 6, wherein an outer envelope of the heat exchanger is concentric with the central bore.

8. The apparatus of claim 6, wherein the central bore has a top and bottom surface spaced apart by opposing side edges.

9. The apparatus of claim 7, wherein the plurality of fins comprise opposing outer fins parallel with the opposing side edges of the central bore and inner fins extending perpendicularly in opposing directions from the top and bottom of the central bore.

10. The apparatus of claim 6, wherein the male power conductor and the female power conductor, the thermistor disposed between the opposing ends and side edges of the base are fully encapsulated in the thermally conductive potting compound and the potting compound is disposed snugly engaging the interior of the internal bore of the heat exchanger for heat transfer from the interior of a 360 degree heat sink enclosure.

11. The apparatus of claim 6, wherein the central bore extends throughout the entire extent of the heat exchanger.

12. The apparatus of claim 6, further comprising:
opposing end caps operably configured to engage axial extremities of the heat exchanger and provide support and protection for the power cord.

13. The apparatus of claim 6, wherein the central bore has a rectangular cross-section.

* * * * *